(12) United States Patent
Shin et al.

(10) Patent No.: US 12,022,695 B2
(45) Date of Patent: Jun. 25, 2024

(54) DISPLAY PANEL INCLUDING THIN FILM TRANSISTORS HAVING DIFFERENT SEMICONDUCTOR MATERIALS FROM EACH OTHER

(71) Applicant: SAMSUNG DISPLAY CO., LTD., Yongin-si (KR)

(72) Inventors: Yoonjee Shin, Hwaseong-si (KR); Kyunghyun Baek, Suwon-si (KR); Seokje Seong, Seongnam-si (KR); Wooho Jeong, Anyang-si (KR); Yoon-jong Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/810,705

(22) Filed: Jul. 5, 2022

(65) Prior Publication Data

US 2022/0352274 A1 Nov. 3, 2022

Related U.S. Application Data

(62) Division of application No. 16/294,193, filed on Mar. 6, 2019, now Pat. No. 11,380,745.

(30) Foreign Application Priority Data

Mar. 7, 2018 (KR) .................. 10-2018-0026998

(51) Int. Cl.
*H10K 59/123* (2023.01)
*G09G 3/3233* (2016.01)
(Continued)

(52) U.S. Cl.
CPC ......... *H10K 59/123* (2023.02); *G09G 3/3233* (2013.01); *H01L 29/41733* (2013.01);
(Continued)

(58) Field of Classification Search
CPC .......... H01L 27/1225; H01L 29/41733; H01L 29/4908; H01L 29/66757; H01L 29/7869;
(Continued)

(56) References Cited

U.S. PATENT DOCUMENTS 6,506,669 B1    1/2003    Kuramasu et al.
6,596,573 B2    7/2003    Lee et al.
(Continued)

FOREIGN PATENT DOCUMENTS

JP    2002299348    10/2002
JP    2013098374    5/2013
(Continued)

*Primary Examiner* — Herve-Louis Y Assouman
*Assistant Examiner* — Christopher M Roland
(74) *Attorney, Agent, or Firm* — F. Chau & Associates, LLC

(57) ABSTRACT

A display panel includes a base layer, a first thin film transistor disposed on the base layer and including a silicon semiconductor pattern, a first control electrode is spaced apart from the silicon semiconductor pattern. A first input electrode is connected to a first side of the silicon semiconductor pattern. A first output electrode is connected to a second side of the silicon semiconductor pattern. The display panel includes a second thin film transistor. An organic light emitting diode includes a first electrode connected to the first thin film transistor, a second electrode, and an emission layer. A first insulating layer includes openings exposing the first side and the second side of the silicon semiconductor pattern, respectively. The first input electrode and the first output electrode are positioned in the openings respectively.

7 Claims, 11 Drawing Sheets

(51) Int. Cl.
*H01L 27/12* (2006.01)
*H01L 29/417* (2006.01)
*H01L 29/49* (2006.01)
*H01L 29/66* (2006.01)
*H01L 29/786* (2006.01)
*H10K 50/805* (2023.01)
*H10K 59/121* (2023.01)
*H10K 59/124* (2023.01)
*G09G 3/3225* (2016.01)

(52) U.S. Cl.
CPC .... *H01L 29/4908* (2013.01); *H01L 29/66757* (2013.01); *H10K 50/805* (2023.02); *H10K 59/1213* (2023.02); *H10K 59/124* (2023.02); *G09G 3/3225* (2013.01); *G09G 2300/0426* (2013.01); *H01L 27/1225* (2013.01); *H01L 29/7869* (2013.01)

(58) Field of Classification Search
CPC ............ H10K 50/805; H10K 59/1213; H10K 59/123; H10K 59/124; G09G 3/3225; G09G 3/3233; G09G 2300/0426
See application file for complete search history.

(56) References Cited

U.S. PATENT DOCUMENTS

| | | |
|---|---|---|
| 7,009,262 B2 | 3/2006 | Isikawa |
| 8,519,406 B2 | 8/2013 | Yoon et al. |
| 9,881,986 B2 | 1/2018 | Cho et al. |
| 10,002,916 B2 | 6/2018 | Shin et al. |
| 10,490,668 B2 | 11/2019 | Noh et al. |
| 11,380,745 B2 * | 7/2022 | Shin ................... H10K 59/1213 |
| 2002/0074548 A1 | 6/2002 | Lee et al. |
| 2003/0169540 A1 | 9/2003 | Granstrom et al. |
| 2006/0145162 A1 | 7/2006 | Yang |
| 2011/0241014 A1 * | 10/2011 | Yoon .................... H10K 59/131 257/72 |
| 2012/0001185 A1 | 1/2012 | Lee |
| 2012/0168745 A1 | 7/2012 | Oh et al. |
| 2014/0168556 A1 | 6/2014 | Liu |
| 2015/0123084 A1 | 5/2015 | Kim et al. |
| 2017/0237037 A1 | 8/2017 | Choi et al. |
| 2018/0019431 A1 | 1/2018 | Kurata et al. |
| 2018/0061868 A1 | 3/2018 | Na et al. |
| 2018/0061921 A1 | 3/2018 | Son et al. |
| 2018/0076238 A1 * | 3/2018 | Lim ................... H01L 27/1225 |
| 2018/0108783 A1 | 4/2018 | Meng |
| 2018/0182832 A1 | 6/2018 | Lee et al. |
| 2018/0366586 A1 | 12/2018 | Son et al. |
| 2019/0074305 A1 | 3/2019 | Gong et al. |
| 2019/0115407 A1 | 4/2019 | Cho et al. |
| 2019/0164998 A1 | 5/2019 | Cho et al. |
| 2019/0181198 A1 | 6/2019 | Son et al. |
| 2019/0280068 A1 | 9/2019 | Shin et al. |
| 2019/0288048 A1 | 9/2019 | Kang et al. |
| 2019/0355799 A1 | 11/2019 | Jeong et al. |
| 2020/0066765 A1 | 2/2020 | Cho et al. |

FOREIGN PATENT DOCUMENTS

| | | |
|---|---|---|
| KR | 100807517 | 2/2008 |
| KR | 101462539 | 11/2014 |
| KR | 10-2015-0101418 | 9/2015 |
| KR | 101561802 | 10/2015 |
| KR | 10-2017-0018197 | 2/2017 |
| KR | 1020170095444 | 8/2017 |
| KR | 10-2019-0003150 | 1/2019 |

* cited by examiner

DISPLAY PANEL INCLUDING THIN FILM TRANSISTORS HAVING DIFFERENT SEMICONDUCTOR MATERIALS FROM EACH OTHER

CROSS-REFERENCE TO RELATED APPLICATIONS

This application is a divisional of U.S. non-provisional patent application Ser. No. 16/294,193 filed on Mar. 6, 2019, which claims priority under 35 U.S.C. § 119 to Korean Patent Application No. 10-2018-0026998, filed on Mar. 7, 2018, the disclosures of which are incorporated by reference herein in their entireties.

TECHNICAL FIELD

Exemplary embodiments of the present invention relate to a display panel, and more particularly, to a display panel including two semiconductor materials and a method of manufacturing the same.

DISCUSSION OF RELATED ART

A display panel may include at least one thin film transistor. The thin film transistor may include a semiconductor pattern including a semiconductor material. The display panel may include a plurality of pixels and a driving circuit for controlling the pixels. The driving circuit may include at least one thin film transistor. The thin film transistors of the driving circuit may provide electrical signals to the pixels. However, misalignment may occur between a source electrode and a connection electrode.

Each of the pixels may include a pixel driving circuit and a display element connected to the pixel driving circuit. The pixel driving circuit may include at least one thin film transistor and a capacitor. The thin film transistor and the capacitor of the pixel driving circuit may control the display element in response to the electrical signal provided from the driving circuit.

SUMMARY

An exemplary embodiment of the present invention provides a display panel having increased process reliability and a method of manufacturing the same.

In an exemplary embodiment of the present invention, a display panel includes a base layer and a first thin film transistor disposed on the base layer and including a silicon semiconductor pattern. A first control electrode is spaced apart from the silicon semiconductor pattern. A first input electrode is connected to a first side of the silicon semiconductor pattern. A first output electrode is connected to a second side of the silicon semiconductor pattern. A second thin film transistor is disposed on the base layer. The second thin film transistor includes an oxide semiconductor pattern. A second control electrode is spaced apart from the oxide semiconductor pattern. A second input electrode is connected to a first side of the oxide semiconductor pattern. A second output electrode is connected to a second side of the oxide semiconductor pattern. An organic light emitting diode includes a first electrode connected to the first thin film transistor. A second electrode is disposed on the first electrode. An emission layer is disposed between the first electrode and the second electrode. A first insulating layer is disposed between the organic light emitting diode and the silicon semiconductor pattern. The first insulating layer is disposed on the silicon semiconductor pattern. The first insulating layer includes a plurality of openings exposing the first side and the second side of the silicon semiconductor pattern, respectively. The first input electrode and the first output electrode are each positioned in an opening of the plurality of openings, respectively.

In an exemplary embodiment of the present invention, the first input electrode and the first output electrode may be disposed on a layer different from a layer on which the second input electrode and the second output electrode are disposed.

In an exemplary embodiment of the present invention, the display panel may include a first connection electrode connected to the first input electrode, and a second connection electrode disposed between the first electrode and the first output electrode and disposed on a same layer as the first connection electrode. The second connection electrode may electrically connect the first output electrode to the first electrode.

In an exemplary embodiment of the present invention, the first connection electrode and the second connection electrode may be disposed on a same layer as the s input electrode and the second output electrode.

In an exemplary embodiment of the present invention, the first input electrode and the first output electrode may include a different material from that of the second input electrode and the second output electrode.

In an exemplary embodiment of the present invention, the display panel may include a bridge electrode disposed between the first electrode and the second connection electrode and connected to the first electrode and the second connection electrode.

In an exemplary embodiment of the present invention, the bridge electrode may have a resistance lower than a resistance of the second connection electrode.

In an exemplary embodiment of the present invention, the display panel may include a second insulating layer disposed between the first insulating layer and the first electrode, and an upper electrode disposed on the second insulating layer. The first control electrode may be disposed between the first insulating layer and the second insulating layer, and the upper electrode may overlap with the first control electrode when viewed in a plan view.

In an exemplary embodiment of the present invention, the upper electrode an first control electrode may receive a same voltage.

In an exemplary embodiment of the present invention, thicknesses of the first input electrode and the first output electrode may be substantially equal to a thickness of the first insulating layer.

In an exemplary embodiment of the present invention, side surfaces of the first input electrode and the first output electrode may have inclined shapes when viewed in a cross-sectional view.

In an exemplary embodiment of the present invention, side surfaces of the first input electrode and the first output electrode need not overlap with the first insulating layer when viewed in a plan view.

In an exemplary embodiment of the present invention, the first input electrode and the first output electrode may substantially completely fill the openings, respectively.

In an exemplary embodiment of the present invention, the first insulating layer may include a plurality of openings exposing a first side and a second side of the oxide semiconductor pattern, respectively. The oxide semiconductor pattern may be disposed on a same layer as the silicon semiconductor pattern, and the second input electrode and the second output electrode may each be positioned in an opening of the plurality of openings exposing the first side and the second side of the oxide semiconductor pattern, respectively.

In an exemplary embodiment of the present invention, a display panel includes a base layer and a thin film transistor disposed on the base layer. The thin film transistor includes a silicon semiconductor pattern. A control electrode is spaced apart from the silicon semiconductor pattern. An input electrode is connected to a first side of the silicon semiconductor pattern. An output electrode is connected to a second side of the silicon semiconductor pattern. A first insulating layer is disposed directly on the silicon semiconductor pattern. The first insulating layer includes a plurality of openings directly exposing the first side and the second side of the silicon semiconductor pattern, respectively. A second insulating layer is disposed on the first insulating layer and the thin film transistor. An organic light emitting diode includes a first electrode disposed on the second insulating layer and connected to the thin film transistor, a second electrode disposed on the first electrode, and an emission layer disposed between the first electrode and the second electrode. A connection electrode is disposed between the second insulating layer and the first electrode. The connection electrode penetrates the second insulating layer to electrically connect the first electrode and the output electrode. The input electrode and the output electrode are each disposed in an opening of the plurality of openings, respectively, to form the same layer with the first insulating layer on the silicon semiconductor pattern.

In an exemplary embodiment of the present invention, top surfaces of the input electrode and the output electrode may be substantially coplanar with a top surface of the first insulating layer.

In an exemplary embodiment of the present invention, the display panel may include a third insulating layer disposed on the second insulating layer and the connection electrode. A bridge electrode may penetrate the third insulating layer to electrically connect the first electrode and the connection electrode.

In an exemplary embodiment of the present invention, the bridge electrode may have a resistance lower than a resistance of the connection electrode.

In an exemplary embodiment of the present invention, the control electrode may overlap with the silicon semiconductor pattern and may be disposed under the first insulating layer.

In an exemplary embodiment of the present invention, the output electrode may be formed of a different material from that of the connection electrode.

In an exemplary embodiment of the present invention, the output electrode, the connection electrode and the bridge electrode may all be aligned with each other along a direction orthogonal to an upper surface of the base layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OE THE EMBODIMENTS

Figure 1:
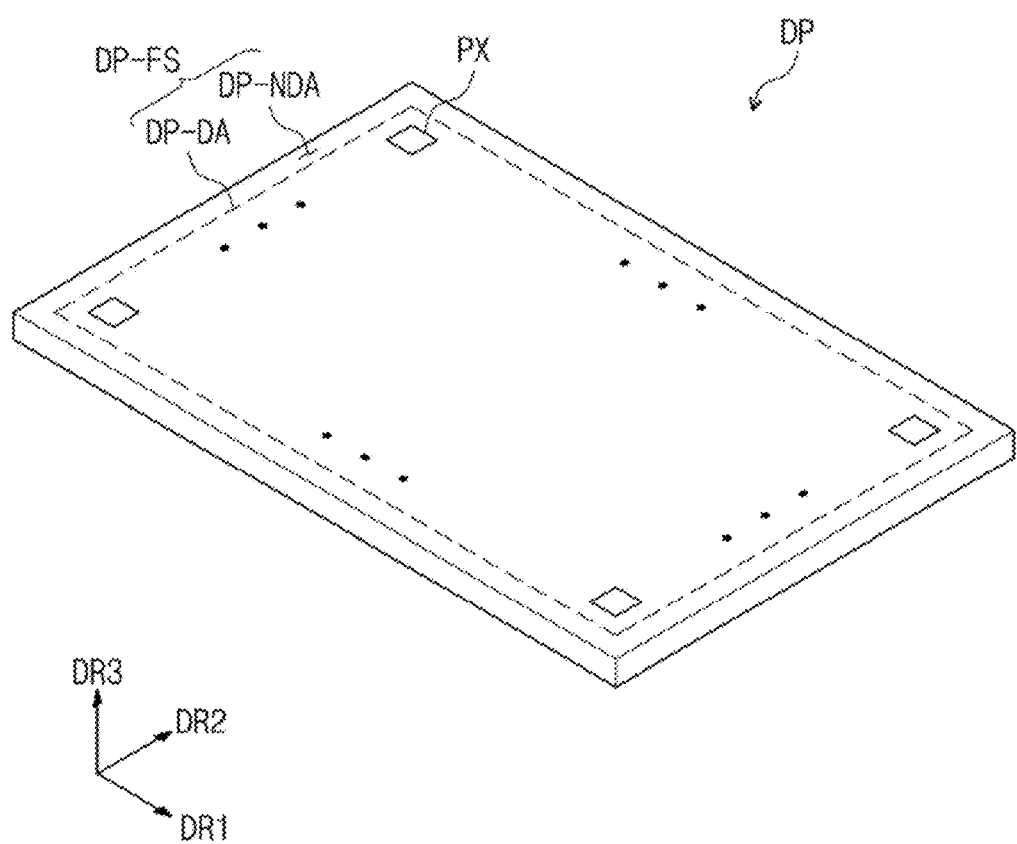
FIG. 1 is a perspective view of a display panel according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

It will be understood that when a component, such as a layer, a film, a region, or a plate, is referred to as being "on" another component, the component may be directly on the other component or intervening components may be present As used herein, the singular forms "a," "an," and "the" may include the plural forms, including "at least one," unless the context clearly indicates otherwise. As used herein, the term "and/or" includes any and all combinations of one or more of the associated listed items.

Spatially relative terms, such as "beneath", "below", "lower", "above", or "upper" may be used herein for clarity of description to describe one element or feature's relationship to another element(s) or feature(s) as described with reference to the figures. It will be understood that the spatially relative terms are intended to encompass different orientations of the device in use or operation in addition to the orientation depicted in the figures. For example, a described device may be otherwise oriented (e.g., rotated 90 degrees or at other orientations) and the spatially relative descriptors used herein interpreted accordingly.

It will be understood that although the terms "first" and "second" may be used herein to describe various components, these components should not be limited by these terms.

Figure 2:
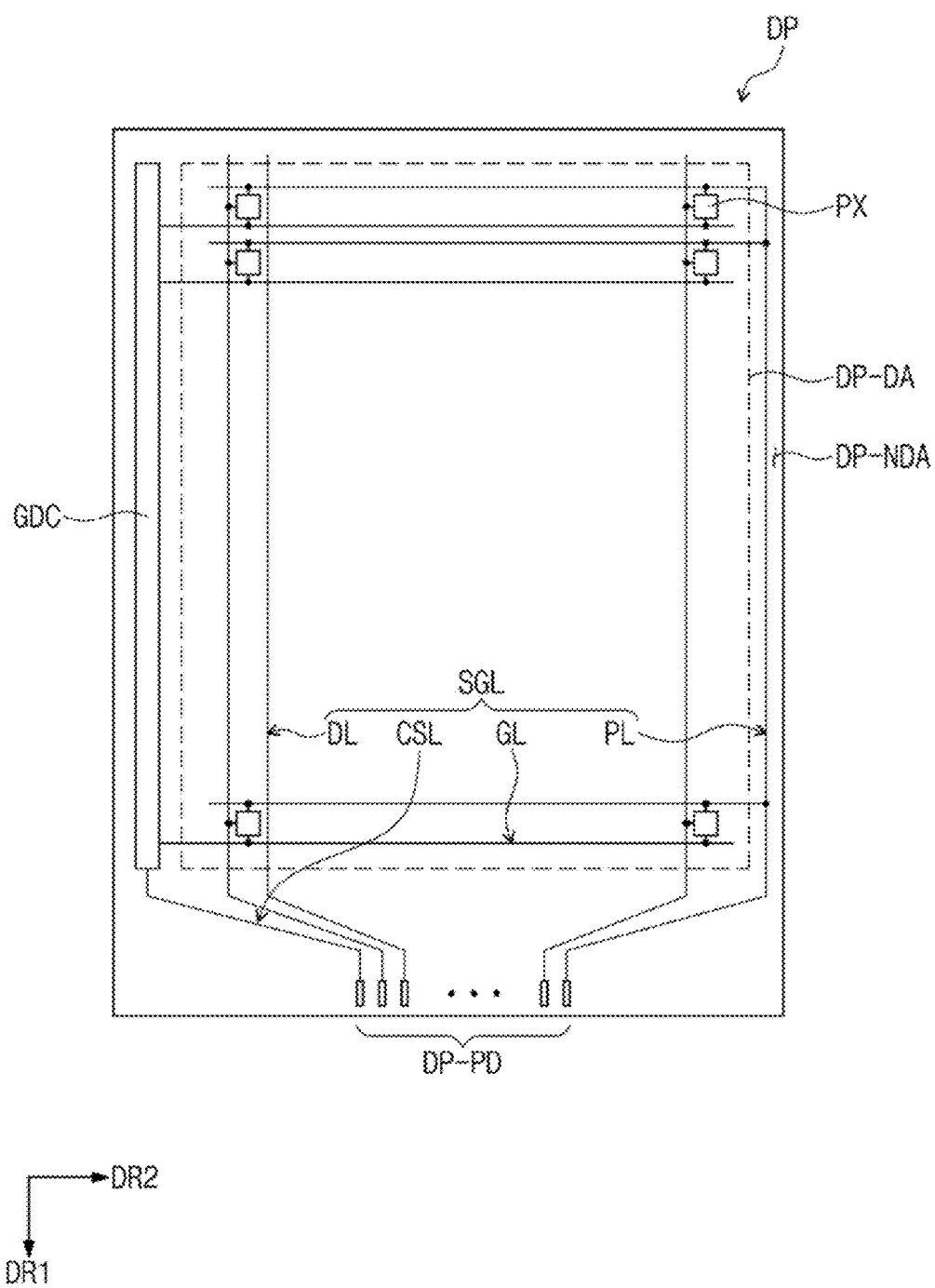
FIG. 2 is a plan view of a display panel according to an exemplary embodiment of the present invention.

FIG. 1 is a perspective view of a display panel according to an exemplary embodiment of the present invention. FIG. 2 is a plan view of a display panel according to an exemplary embodiment of the present invention.

Referring to FIGS. 1 and 2, a front surface DP-FS of a display panel DP may extend along a plane defined by a first direction DR1 and a second direction DR2. As an example, the first direction DR1 may be perpendicular to the second direction DR2. The first direction DR1 and the second direction DR2 may define a plane along which the display panel extends. A third direction DR3 may be perpendicular to the first and second directions DR1 and DR2. Thus, the third direction DR3 may be orthogonal to a plane extending in the first and second directions DR1 and DR2.

A normal direction of the front surface DP-FS of the display panel DP a thickness direction of the display panel DP) may be indicated by the third direction DR3. A top surface (e.g., or a front surface) and a bottom surface (e.g., or a rear surface) of each of layers included in the display panel DP may be defined by the third direction DR3.

The display panel DP may include a display area DP-DA and a non-display area DP-NDA in the front surface DP-FS. Pixels PX may be disposed in the display area DP-DA and the non-display area DP-NDA may be adjacent to the display area DP-DA. The display area. DP-DA may include a plurality of pixels PX. As an example, the pixels PX may be spaced apart from each other or may be immediately adjacent to each other. The pixels PX may be arranged in a plurality of rows and columns on or above an underlying substrate. Thus, the pixels PX may be arranged in a matrix configuration.

The display area DP-DA may have one of various shapes. For example, the display area DP-DA may have a quadrilateral shape (e.g., a rectangular shape or a square shape). Alternatively, the display area DP-DA may have a circular shape.

The non-display area DP-NDA may be adjacent to the display area DP-DA. In an exemplary embodiment of the present invention, the non-display area DP-NDA may surround the display area DP-DA when viewed in a plan view. As an example, the non-display region DP-NDA may be arranged at four sides of the display region DP-DA in a plan view (e.g., along the third direction DR3); however, exemplary embodiments of the present invention are not limited thereto. For example, the non-display region DP-NDA may be arranged at less than four sides (e.g., three sides) of the display region DP-DA in a plan view. The shapes of the display area DP-DA and the non-display area DP-NDA may be variously modified, as desired. For example, the non-display area. DP-NDA may be disposed at only one or both sides of the display area DP-DA.

Figure 3:
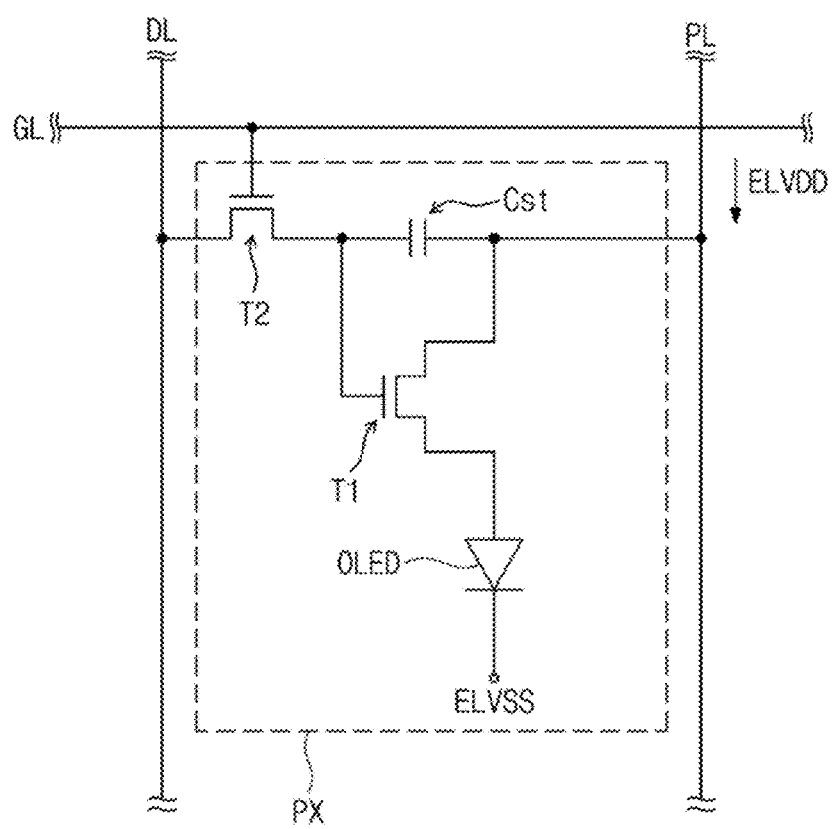
FIG. 3 is an equivalent circuit diagram of a pixel according to an exemplary embodiment of the present invention.
Figure 4:
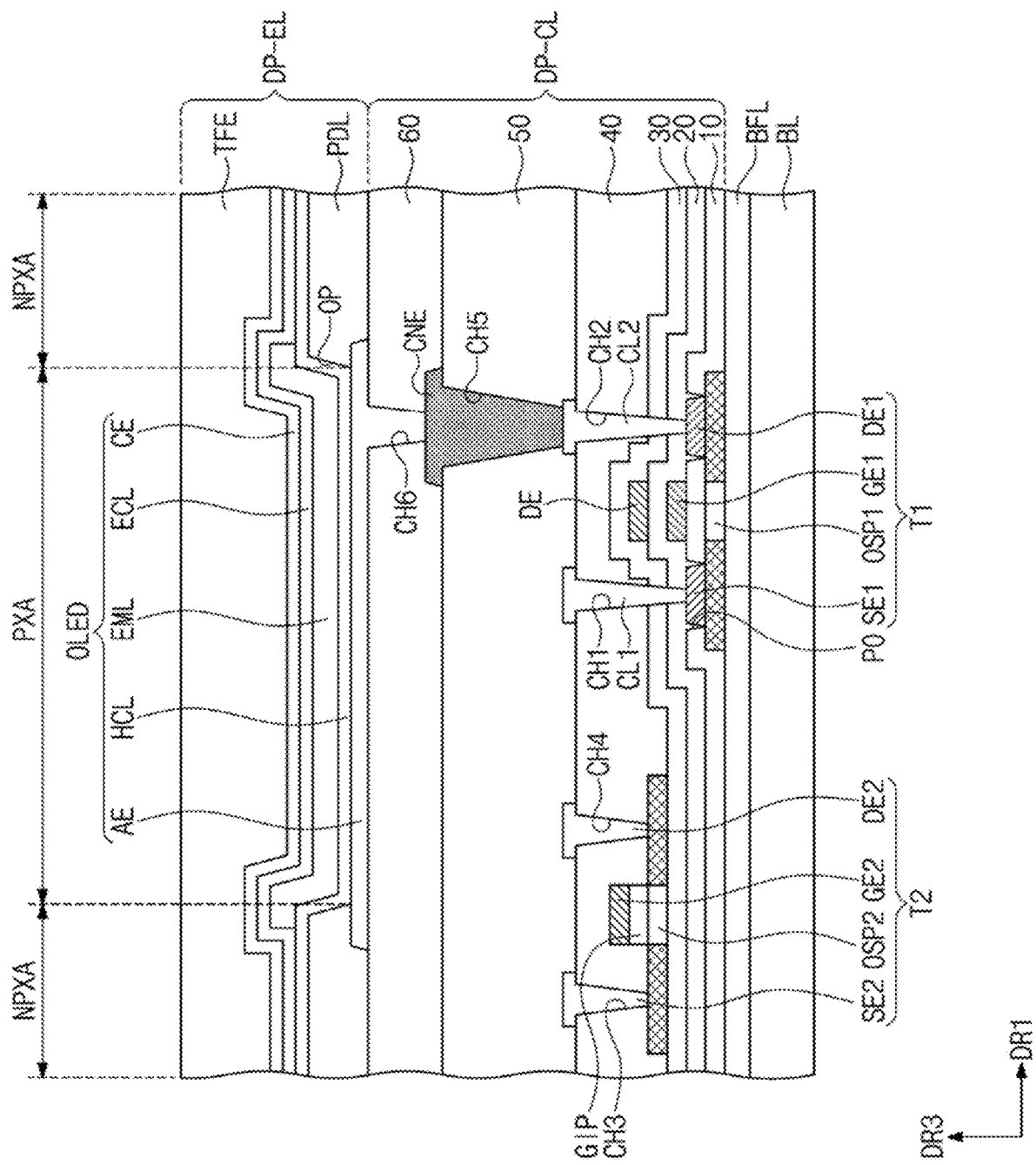
FIG. 4 is a cross-sectional view of a portion of a pixel according to an exemplary embodiment of the present invention.

FIG. 2 schematically illustrates the connection relationship of the pixels PX, a driving circuit GDC and signal lines SGL. FIG. 3 is an equivalent circuit diagram of a pixel according to an exemplary embodiment of the present invention. FIG. 4 is a cross-sectional view of a portion of a pixel according to an exemplary embodiment of the present invention.

Referring to FIGS. 1 to 4 the display panel DP may include a driving circuit GDC, a plurality of signal lines SGL, a plurality of signal pads DP-PD, and a plurality of the pixels PX.

The pixels PX may be divided into a plurality of groups on the basis of colors of lights emitted from the pixels PX. For example, the pixels PX may include red pixels, green pixels, and blue pixels. In an exemplary embodiment of the present invention, the pixels PX may further include white pixels.

The driving circuit GDC may include a scan driving circuit. The scan driving circuit may generate a plurality of scan signals and may sequentially output the scan signals to plurality of scan lines GL. The scan driving circuit may further output other control signals to pixel driving circuits of the pixels PX.

The scan driving circuit may be formed together with the pixel driving circuits of the pixels PX by a same process.

The signal lines SGL may include scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may provide control signals to the scan driving circuit. Each of the signal pads DP-PD may be connected to a corresponding one of the signal lines SGL.

A circuit board may be electrically connected to the display panel D. The circuit board may be a rigid circuit board or a flexible circuit board. A driving chip may be mounted on the circuit board.

As an example, the driving chip may be mounted on the display panel DP. In the event that the driving chip is mounted on the display panel DP, the design of the signal lines SGL may be changed. For example, the driving chip may be connected to the data lines DL, and additional signal lines connecting the driving chip to the signal pads DP-PD may be disposed.

According to an exemplary embodiment of the present invention, one scan line GL, one data line DL, the power line PL, and the pixel PX connected to lines GL, DL and PL may be provided. In an exemplary embodiment of the present invention, the pixel PX may include an organic light emitting diode or a quantum-dot light emitting diode as a light emitting element. An emission layer of the organic light emitting diode may include an organic light emitting material. An emission layer of the quantum-dot light emitting diode may include quantum dots and/or quantum rods. The pixel PX corresponding to an organic light emitting pixel will be described in more detail below as an example; however, exemplary embodiments of the present invention are not limited thereto.

The pixel PX may include an organic light emitting diode OLED and a pixel driving circuit for driving the organic light emitting diode OLED. The organic light emitting diode OLED may be a front surface light emitting type diode or a rear surface light emitting type diode. In an exemplary embodiment of the present invention, the pixel driving circuit may include a first thin film transistor T1 (e.g., which may be a driving transistor), a second thin film transistor T2 (e.g., which may be a switching transistor), and a capacitor Cst. A first power source voltage ELVDD may be provided to a terminal of the organic light emitting diode OLED through the first thin film transistor T1, and a second power source voltage ELVSS may be provided to another terminal of the organic light emitting diode OLED. The second power source voltage ELVSS may be lower than the first power source voltage ELVDD.

The first thin film transistor T1 may be connected to the organic light emitting diode OLED. The first thin film transistor T1 may control a driving current flowing through the organic light emitting diode OLED in response to the amount of charges stored in the capacitor Cst. The second thin film transistor T2 may output a data signal of the data line DL in response to a scan signal applied to the scan line GL. The capacitor Cst may be charged with a voltage corresponding to the data signal received from the second thin film transistor T2.

However, the configuration of the pixel PX is not limited to the examples described above (e.g., with respect to FIG. 3) but may be variously modified, as desired. In an exemplary embodiment of the present invention, the pixel driving circuit for controlling the organic light emitting diode OLED may include three or more thin film transistors. In an exemplary embodiment of the present invention, the organic light emitting diode OLED may be connected between the power line PL and the second thin film transistor T2.

FIG. 4 illustrates a cross-sectional view corresponding to the first thin film transistor T1, the second thin film transistor T2 and the organic light emitting diode OLED, which may be included in the pixel PX.

The display panel DP may include a base layer BL, a circuit element layer DP-CL and a displays element layer DP-EL. The display panel DP may further include functional layers such as an anti-reflection layer and/or a refractive index adjusting layer. The circuit element layer DP-CL may include the first thin film transistor T1, the second thin film transistor T2, a plurality of insulating layers 10, 20, 30, 40, 50 and 60, an upper electrode DE, connection electrodes CL1 and CL2, and a bridge electrode CNE. The circuit element layer DP-CL may be thrilled through coating and/or deposition processes of forming an insulating layer, a semiconductor layer and a conductive layer and processes of patterning the insulating layer, the semiconductor layer and the conductive layer using photolithography processes. Each of the insulating layers 10, 20, 30, 40, 50 and 60 may include an organic layer and/or an inorganic layer. The display element layer DP-EL may include the organic light emitting diode OLED, a pixel defining layer PDL, and a thin film encapsulation layer TFE.

The first thin film transistor T1, the second thin film transistor T2 and the capacitor Cst may be disposed on the base layer BL. The base layer BL may include a synthetic resin film. The synthetic resin film may include a thermosetting resin. For example, the synthetic resin film may be a polyimide-based resin film. However, exemplary embodiments of the present invention are not limited to a synthetic resin film including a particular material. In an exemplary embodiment of the present invention, the synthetic resin film may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, or a perylene-based resin. In an exemplary embodiment of the present invention, the base layer BL may include a glass substrate, a metal substrate, or an organic/inorganic composite material substrate.

An inorganic layer BFL may be disposed on a top surface of the base layer BL (e.g., a surface of the base layer BL facing the first thin film transistor T1). The inorganic layer BFL may include a barrier layer and/or a buffer layer. The inorganic layer BFL may include at least one of aluminum oxide, titanium oxide, silicon oxide, silicon oxynitride, zirconium oxide, or hafnium oxide. The inorganic layer BFL may have a multi-layered structure. The multi-layered inorganic layer BFL may have the barrier layer and the buffer layer, as described above. The barrier layer and the buffer layer may be selectively disposed. Alternatively, the inorganic layer BFL may have a single layer structure.

The barrier layer may prevent a foreign material from permeating from the outside. The barrier layer may include a silicon oxide layer and a silicon nitride layer. The silicon oxide layer and the silicon nitride layer may be alternately stacked. For example, the silicon oxide layer and the silicon nitride layer may be alternately and repeatedly stacked.

The buffer layer may increase bonding strength between components disposed on and under the buffer layer. The buffer layer may include a silicon oxide layer and a silicon nitride layer. The silicon oxide layer and the silicon nitride layer may be alternately stacked. For example, the silicon oxide layer and the silicon nitride layer may be alternately and repeatedly stacked.

The first thin film transistor T1 may include a first input electrode SE1, a first output electrode DE1, a first control electrode GE1, and a first semiconductor pattern OSP1. The second thin film transistor T2 may include a second input electrode SE2, a second output electrode DE2, a second control electrode GE2, and a second semiconductor pattern OSP2.

The first semiconductor pattern OSP1 may be disposed on the inorganic layer BFL. For example, the first semiconductor pattern OSP1 may be in direct contact with the inorganic layer BFL. The first semiconductor pattern OSP1 may include a crystalline semiconductor material. For example, the first semiconductor pattern OSP1 may include a poly crystalline semiconductor material such as poly-crystalline silicon. Thus, the first semiconductor pattern OSP1 may be interchangeably referred to herein as a silicon semiconductor pattern. Since the poly-crystalline silicon layer has a high field effect mobility, it may be applied to a relatively high-speed operation circuit. Thus performance speed and reliability of the display panel DP may be increased.

However, exemplary embodiments of the present invention are not limited thereto. In an exemplary embodiment of the present invention, the first semiconductor pattern OSP1 may include amorphous silicon. The first semiconductor pattern OSP1 may include an input region (e.g., or a first portion), an output region (e.g., or a second portion), and a channel region (e.g., or a third portion) defined between the input region and the output region. In an exemplary embodiment of the present invention (see, e.g., FIG. 4), the input region and the output region may have slanted side surfaces.

The channel region of the first semiconductor pattern OSP1 may be defined to overlap with the first control electrode GE1 (e.g. along the third direction DR3). The input region and the output region may be doped with do pants and may have conductivity higher than that of the channel region. The input region and the output region may be doped with N-type dopants. In an exemplary embodiment of the present invention, the first thin film transistor T1 may be an N-type transistor. However, exemplary embodiments of the present invention are not limited thereto. In an exemplary embodiment of the present invention, the first thin film transistor T1 may be a P-type transistor.

A first insulating layer 10 may be disposed on the inorganic layer BFL. The first insulating layer 10 may overlap (e.g., along the third direction DR3) with the plurality of pixels PX (see, e.g., FIG. 1). The first insulating layer may substantially cover the first semiconductor pattern OSP1. The first insulating layer 10 may include an inorganic layer and/or an organic layer and may have a single-layered or multi-layered structure. The first insulating layer 10 may include at least one of aluminum oxide, titanium oxide, silicon oxide, silicon oxynitride, zirconium oxide, or hafnium oxide. In an exemplary embodiment of the present invention, the first insulating layer 10 may be a single-layered silicon oxide layer.

The first insulating, layer 10 may have a plurality of openings PO exposing a first side and a second side of the first semiconductor pattern OSP1, respectively. The first side of the first semiconductor pattern OSP1 may be opposite the second side (e.g., along the first direction DR1). As an example, a portion of the first side and a portion of the second side of the first semiconductor pattern OSP1 may be exposed by the openings PO in the first insulating layer 10. The first input electrode SE1 and the first output electrode DE1 may be positioned (e.g., embedded) in the openings PO, respectively. Herein, the term 'embedded' may mean that the first input electrode SE1 and the first output electrode DE1 are disposed in the openings PO, respectively, to not overlap with a top surface of the first insulating layer 10 in a plan view. As an example, top surfaces of the first input electrode SE1 and the first output electrode DE1 do not extend onto the top surface of the first insulating layer 10. Further, top surfaces of the first input electrode SE1 and the first output electrode DE1 may be spaced apart from the top surfaces of the first insulating layer 10. Thus, a portion of the openings PO may separate the top surfaces of the first input electrode SE1 and the first output electrode DE1 from the top suffices of the first insulating layer 10 (see, e.g., FIG. 4).

Thicknesses of the first input electrode SE1 and the first output electrode DE1 in the third direction DR3 from the first semiconductor pattern OSP1 may be substantially equal to a thickness of the first insulating layer 10. Thus, the top surfaces of the first input electrode SE1 and the first output electrode DE1 which are embedded may be substantially coplanar (e.g., along the first and/or second directions DR1 and/or DR2) with the top surface of the first insulating layer 10. A tolerance occurring in an embedding process according to an exemplary embodiment of the present invention will be described in more detail below. As an example, an exemplary embodiment of the present invention may include a case in which the thicknesses of the first input electrode SE1 and the first output electrode DE1 are slightly less or greater than the thickness of the first insulating layer 10 (e.g., along the third direction DR3). In an exemplary embodiment of the present invention, side surfaces of the first input electrode SE1 and the first output electrode DE1 may be inclined (e.g., when viewed in a cross-sectional view).

The first control electrode GE1 may be disposed on the first insulating layer 10. The first control electrode GE1 may overlap with the channel region of the first semiconductor pattern OSP1 (e.g., along the third direction DR3).

A second insulating layer 20 may be disposed on the first insulating layer 10. The second insulating layer 20 may substantially cover the first insulating layer 10 and the first control electrode GE1. The second insulating, layer 20 may overlap (e.g., along the third direction DR3) with the plurality of pixels PX (see, e.g., FIG. 1). The second insulating layer 20 may be disposed on the first input electrode SE1 and the first output electrode DE1. In an exemplary embodiment of the present invention, the first input electrode SE1 and the first output electrode DE1 may be substantially covered by the second insulating layer 20.

The second insulating layer 20 may include an inorganic layer and/or an organic layer and may have a single-layered or multi-layered structure. The second insulating layer 20 may include at least one of aluminum oxide, titanium oxide, silicon oxide, silicon oxynitride, zirconium oxide, or hafnium oxide. In an exemplary embodiment of the present invention, the second insulating layer 20 may be a single-layered silicon oxide layer.

The upper electrode DE may be disposed on the second insulating layer 20. The upper electrode DE may overlap with the first control electrode GE1 (e.g., along the third direction DR3). The upper electrode DE may receive an electrical signal different from an electrical signal applied to the first control electrode GE1. At this time, the first control electrode GE1 and the upper electrode DE may form an electric field.

However, exemplary embodiments of the present invention are not limited thereto. In an exemplary embodiment of the present invention, the upper electrode DE and the first control electrode GE1 may receive a same electrical signal. In this case, the first thin film transistor T1 may have a double gate structure. The upper electrode DE and the first control electrode GE1 may control an on-off voltage of the channel region.

A third insulating layer 30 may be disposed on the second insulating layer 20 and may substantially cover the upper electrode DE. The third insulating layer 30 may include an inorganic layer and/or an organic layer and may have a single-layered or multi-layered structure. The third insulating layer 30 may include at least one of aluminum oxide, titanium oxide, silicon oxide, silicon oxynitride, zirconium oxide, or hafnium oxide. In an exemplary embodiment of the present invention, the third insulating layer 30 may be a single-layered silicon oxide layer.

The second semiconductor pattern OSP2 may be disposed on the third insulating layer 30. The second semiconductor pattern OSP2 may include an oxide semiconductor. Thus, the second semiconductor pattern OSP2 may be interchangeably referred to as an oxide semiconductor pattern. The second semiconductor pattern OSP2 may include a crystalline or amorphous oxide semiconductor. For example, the oxide semiconductor may include a metal oxide of zinc (Zn), indium (In), gallium (Ga), tin (Sn), and/or titanium (Ti) or may include a mixture of a metal (e.g., zinc (Zn), indium (In), gallium (Ga), tin (Sn), and/or titanium (Ti)) and an oxide thereof. For example, the oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

The second semiconductor pattern OSP2 may include an input region (e.g., or a first portion), an output region (e.g., or a second portion), and a channel region (e.g., or a third portion) defined between the input region and the output region. Electrical conductivities of the input and output regions of the second semiconductor pattern OSP2 may be higher than that of the channel region of the second semiconductor pattern OSP2. The channel region of the second semiconductor pattern OSP2 may be defined to overlap with the second control electrode GE2 to be described later.

The input region and the output region may include a reduced metal material of the second semiconductor pattern OSP2. As an example, the input region and the output region may include the metal material reduced from the metal oxide forming the channel region. Thus, a leakage current of the second thin film transistor T2 may be lowered. As a result, the second thin film transistor T2 may function as a switching element with on-off characteristics having increased accuracy and reliability.

An insulating pattern GIP may be disposed on the channel region of the second semiconductor pattern OSP2. The second control electrode GE2 may be disposed on the insulating pattern GIP. The second control electrode GE2 may overlap with at least the insulating pattern GIP (e.g., along the third direction DR3). An edge of the insulating pattern GIP may be aligned with an edge of the second control electrode GE2 (e.g., along the third direction DR3). The second control electrode GE2 may have the same shape as the insulating pattern GIP (e.g., when viewed in a plan view and/or when viewed in a cross-sectional view). A boundary between the channel region and the input region and a boundary between the channel region and the output region may be substantially aligned with the edge of the insulating pattern GIP.

The fourth insulating layer 40 may be disposed on the third insulating layer 30 and may substantially cover the second semiconductor pattern OSP2 and the second control electrode GE2. The fourth insulating layer 40 may include an inorganic layer and/or an organic layer and may have a single-layered or multi-layered structure. The fourth insulating layer 40 may include at least one of aluminum oxide, titanium oxide, silicon oxide, silicon oxynitride, silicon nitride, zirconium oxide, or hafnium oxide. In an exemplary embodiment of the present invention, the fourth insulating layer 40 may include a silicon oxide layer and a silicon nitride layer. In an exemplary embodiment of the present invention, the fourth insulating layer 40 may include silicon oxide layers and silicon nitride layers, which are alternately stacked.

A first connection electrode CL1, a second connection electrode CL2, the second input electrode SE2 and the second output electrode DE2 may be disposed on the fourth insulating layer 40. The fourth insulating layer 40 may include a plurality of contact holes CH1, CH2, CH3 and CH4 penetrating the fourth insulating layer 40. The first connection electrode CL1 may be connected to the first input electrode SE1 and the input region of the first semiconductor pattern OSP1 through a first contact hole CH1. The second connection electrode CL2 may be connected to the first output electrode DE1 and the output region of the first semiconductor pattern OSP1 through a second contact hole CH2.

The second input electrode SE2 and the second output electrode DE2 may be connected to the second semiconductor pattern OSP2 through a third contact hole CH3 and a fourth contact hole CH4, which expose the input region and the output region of the second semiconductor pattern OSP2, respectively.

The connection electrodes CL1 and CL2 may be components connecting the first thin film transistor T1 to external components. The first connection electrode CL1 may connect the first input electrode SE1 to an external component (e.g., the capacitor Cst described with reference to FIG. 2), and the second connection electrode CL2 may connect the first output electrode DE1 to the bridge electrode CNE.

The first and second connection electrodes CL1 and CL2 may each include at least one of Ti, Mo, Al, Cu, or a combination thereof. Alternatively, the first and second connection electrodes CL1 and CL2 may each include at least one of ITO, IZO, ZnO, $In_2O_3$, $SnO_2$, $AlZnO_x$, or a combination thereof.

The connection electrodes CL1 and CL2 may be disposed on a same layer as the second input electrode SE2 and the second output electrode DE2. The connection electrodes CL1 and CL2 may include a same material as the second input electrode SE2 and the second output electrode DE2.

Thus, according to an exemplary embodiment of the present invention, the second input electrode SE2 and the second output electrode DE2 of the second thin film transistor T2 may be formed by a same processes as the first and second connection electrodes CL1 and CL2, and thus manufacturing processes may be simplified and a process cost may be reduced.

However, exemplary embodiments of the present invention are not limited thereto. In an exemplary embodiment of the present invention, the connection electrodes CL1 and CL2 may be disposed on a layer different from a layer on which the second input electrode SE2 and the second output electrode DE2 are disposed. In addition, the connection electrodes CL1 and CL2 may include a material different from that of the second input electrode SE2 and the second output electrode DE2 and may be formed by processes independent of processes of forming the second input electrode SE2 and the second output electrode DE2. Since the first input electrode SE1 and the first output electrode DE1 of the first thin film transistor T1 are disposed in the openings PO of the first insulating layer 10, the first input electrode SE1 and the first output electrode DE1 may include a material different from that of the second input electrode SE2 and the second output electrode DE2.

A fifth insulating layer 50 may be disposed on the fourth insulating layer 40 and may substantially cover the second input electrode SE2, the second output electrode DE2, the first connection electrode CL1, and the second connection electrode CL2. The fifth insulating layer 50 may include an organic layer and may have a single-layered or multi-layered structure.

The bridge electrode CNE may be disposed on the fifth insulating layer 50. The bridge electrode CNE may be connected to the second connection electrode CL2 through a fifth contact hole CH5 penetrating the fifth insulating layer 50. The bridge electrode CNE may include a material having a resistance lower than that of the second connection electrode CL2. Thus, the second connection electrode CL2 may be connected to a first electrode AE described in more detail below.

A sixth insulating layer (e.g., or a passivation layer) 60 may be disposed on the fifth insulating layer 50 and may substantially cover the bridge electrode CNE. The sixth insulating layer 60 may include an organic layer and may have a single-layered or multi-layered structure.

In an exemplary embodiment of the present invention, each of the fifth and sixth insulating lavers 50 and 60 may be a single-layered polyimide-based resin layer. However, exemplary embodiments of the present invention are not limited thereto. In an exemplary embodiment of the present invention, each of the fifth and sixth insulating layers 50 and 60 may include at least one of an acrylic-based resin, a methacrylic-based resin, polyisoprene, a vinyl-based resin, an epoxy-based resin, a urethane-based resin, a cellulose-based resin, a siloxane-based resin, a polyamide-based resin, or a perylene-based resin.

The organic light emitting diode OLED may be disposed on the sixth insulating layer 60. The organic light emitting diode OLED may include a first electrode AE, a first charge control layer HCL, an emission layer EML, a second charge control layer ECL, and a second electrode CE. In an exemplary embodiment of the present invention, the first electrode AE, the first charge control layer HCL, the emission layer EML, the second charge control layer ECL and the second electrode CE may correspond to an anode electrode, a hole control layer, an emission layer, an electron control layer, and a cathode electrode, respectively.

However, exemplary embodiments of the present invention are not limited thereto. In an exemplary embodiment of the present invention, the first electrode AE, the first charge control layer HCL, the emission layer EML, the second charge control layer and the second electrode CE may be the cathode electrode, the electron control layer, the emission layer, the hole control layer and the anode electrode, respectively.

The first electrode AE may be connected to the bridge electrode CNE through a sixth contact prole CH6 penetrating the sixth insulating layer 60. Thus, according to an exemplary embodiment of the present invention, the first electrode AE may be electrically connected to the output region of the first semiconductor pattern OSP1 through the bridge electrode CNE and the second connection electrode CL2 connected to the bridge electrode CNE.

The pixel defining layer PDL may be disposed on the sixth insulating layer 60. An opening OP of the pixel defining layer PDL may expose at least a portion of the first electrode AE. The opening OP of the pixel defining layer PDL may define a light emitting area PXA of the pixel. For example, the pixels PX (see, e.g., FIG. 1) may be regularly arranged in the display panel DP (e.g., when viewed in a plan view). An area in which each of the pixels PX is disposed may be defined as a pixel area, and the pixel area may include the light emitting area PXA and a non-light emitting area NPXA adjacent to the light emitting area PXA. The non-light emitting area NPXA may surround the light emitting area PXA when viewed in a plan view.

The first charge control layer HCL may be disposed on and may substantially cover the first electrode AE exposed by the opening OP of the pixel defining layer PDL. The first charge control layer may be disposed in common in the light emitting area PXA and the non-light emitting area NPXA. A common layer such as the first charge control layer HCL may be thrilled in common in the plurality of pixels PX. The first charge control layer HCL may control movement of holes. For example, the first charge control layer HCL may include a hole transfer layer and a bole injection layer.

The emission layer EML may be disposed on the first charge control layer HCL. The emission layer EML may be locally disposed in an area substantially corresponding to the opening OP. The emission layers EML respectively included in the pixels PX may be separated from each other.

In an exemplary embodiment of the present invention, a patterned emission layer EML is described as an example. However, in an exemplary embodiment of the present invention, the emission layer EML may be disposed in common in the plurality of pixels PX. In this case, the emission layer EML may generate white light. In an exemplary embodiment of the present invention, the emission layer EML may have a multi-layered structure.

The second charge control layer ECL may be disposed on the emission layer EML. The second charge control layer ECL may control movement of electrons. For example, the second charge control layer ECL may include an electron transfer layer and an electron injection layer. The second electrode CE may be disposed on the second charge control layer ECL. The second charge control layer ECL and the second electrode CE may be in direct contact with each other in the plurality of pixels PX.

The thin film encapsulation layer TFE may be disposed on the second electrode CE. The thin film encapsulation layer TFE may be disposed in common in the plurality of pixels PX. In an exemplary embodiment of the present invention, the thin film encapsulation layer TFE may be in direct contact with and may substantially cover the second electrode CE. In an exemplary embodiment of the present invention, a capping layer covering the second electrode CE may further be disposed.

The thin film encapsulation layer TFE may include at least one inorganic layer and/or at least one organic layer. In an exemplary embodiment of the present invention, the thin film encapsulation layer TFE may include two inorganic layers and an organic layer disposed between the two inorganic layers. In an exemplary embodiment of the present invention, the thin film encapsulation layer TFE may include inorganic layers and organic layers, which are alternately stacked.

The inorganic layer of the thin film encapsulation layer TFE may protect the organic light emitting diode OLED from moisture/oxygen, and the organic layer of the thin film encapsulation layer TFE may protect the organic light emitting diode OLED from a foreign material such as dust particles. The inorganic layer of the thin film encapsulation layer TFE may include at least one of, but not limited to, a silicon nitride layer, a silicon oxynitride layer, a silicon oxide layer, a titanium oxide layer, or an aluminum oxide layer. The organic layer of the thin film encapsulation layer TFE may include, but not limited to, an acrylic-based organic layer.

According to an exemplary embodiment of the present invention, the first thin film transistor T1 may include the silicon semiconductor (e.g., the poly-crystalline silicon semiconductor) and thus may have a relatively high electron mobility. In addition, since the second thin film transistor T2 includes the oxide semiconductor, the leakage current of the second thin film transistor T2 may be reduced. As a result, a driving voltage of the pixel PX (see, e.g., FIG. 3) may be reduced and an occurrence of a malfunction of the pixel PX may be reduced or eliminated.

According to an exemplary embodiment of the present invention, a first electrode and a second electrode of the capacitor Cst may be formed by a same processes as at least some components of the first thin film transistor T1.

According to an exemplary embodiment of the present invention, the input and output electrodes disposed on the input and output regions of the semiconductor pattern (e.g., the first semiconductor pattern) may be embedded in the openings of the insulating layer, and thus it is possible to minimize or prevent misalignment which may occur when a contact hole is formed by etching different insulating layers. This may be because the contact hole is formed at a position corresponding to a position of the embedded electrode and is thus formed at a desired position. According to an exemplary embodiment of the present invention, reliability of electrical connection between the electrodes in the display panel may be increased.

In an exemplary embodiment of the present invention, a display panel may include the base layer BL and the thin film transistor T1 disposed on the base layer BL. The thin film transistor T1 may include the silicon semiconductor pattern OSP1, the input electrode SE1 and the output electrode DE1. An insulating layer (e.g., insulating layers 10 and 20) may substantially cover upper and side surfaces of each of the input electrode SE1 and the output electrode DE1. Thus, the insulating layer may include a plurality of insulating layers. The organic light emitting diode OLED may include the first electrode AE positioned above the thin film transistor T1. The connection electrode CL2 may penetrate the insulating layer. The connection electrode CL2 may be directly connected with the output electrode DE1. The bridge electrode CNE may be disposed between the connection electrode CL2 and the first electrode AE. The bridge electrode CNE may electrically connect the connection electrode CL2 and the first electrode AE to each other.

In an exemplary embodiment of the present invention, the output electrode DE1, the connection electrode CL2 and the bridge electrode CNE may all be aligned with each other along a direction orthogonal to an upper surface of the base layer BL (e.g., along the third direction DR3).

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

Figure 5:
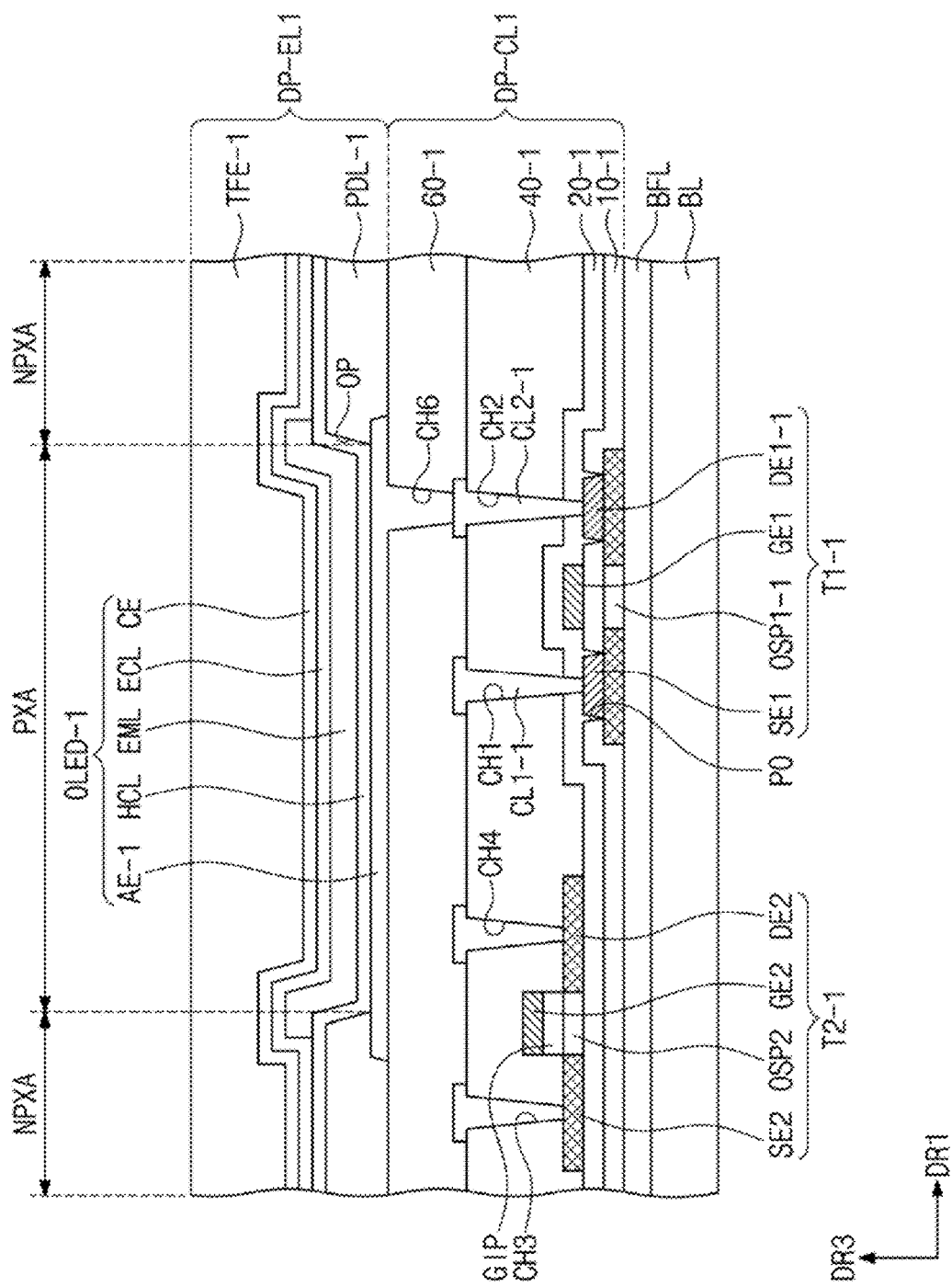
FIG. 5 is a cross-sectional view of a portion of a pixel according to an exemplary embodiment of the present invention.

FIG. 5 is a cross-sectional view of a portion of a pixel according, to an exemplary embodiment of the present invention.

Referring to FIG. 5, in an exemplary embodiment of the present invention, a circuit element layer DP-CL1 may include a first thin film transistor T1-1, a second thin film transistor T2-1, connection electrodes CL1-1 and CL2-1, and a plurality of insulating layers 10-1, 20-1, 40-1 and 60-1. A display element layer DP-EL1 may include an organic light emitting diode OLED-1, a pixel defining layer PDL-1, and a thin film encapsulation layer TFE-1.

The first thin film transistor T1-1, the second thin film transistor T2-1, the connection electrodes CL1-1 and CL2-1 and the display element layer DP-EL1 described with reference to FIG. 5 may correspond to the first thin film transistor T1, the second thin film transistor T2, the connection electrodes CL1 and CL2 and the display element layer DP-EL described with reference to FIG. 4, respectively. Thus, duplicative descriptions may be omitted below.

The upper electrode DE, the third insulating layer 30, the bridge electrode CNE and the fifth insulating layer 50 may be omitted in a display panel according to an exemplary embodiment of the present invention, and other components of the display panel according to an exemplary embodiment of the present invention described with reference to FIG. 5 may correspond to corresponding components of the display panel described with reference to FIG. 4.

According to an exemplary embodiment of the present invention, a first output electrode DE1-1 of the first thin film transistor T1-1 may be connected to the second connection electrode CL2-1 which is disposed on the fourth insulating layer 40-1 and extends into the second contact hole CH2 penetrating the fourth insulating layer 40-1. The second connection electrode may be connected directly to a first electrode AE-1 of the organic light emitting diode OLED-1, which extends into the sixth contact hole CH6 of the sixth insulating layer 60-1. Thus, according to an exemplary embodiment of the present invention, the first electrode AE-1 may be electrically connected to a first semiconductor pattern OSP1-1 of the first thin film transistor T1-1 through the second connection electrode CL2-1.

In an exemplary embodiment of the present invention, the second connection electrode CL2-1 may be connected directly to the first electrode AE-1. As a result, the fifth insulating layer between the fourth and sixth insulating layers 40-1 and 60-1 may be omitted, and thus a thickness of the display panel (e.g., along the third direction DR3) may be reduced and manufacturing processes may be simplified.

Figure 6:
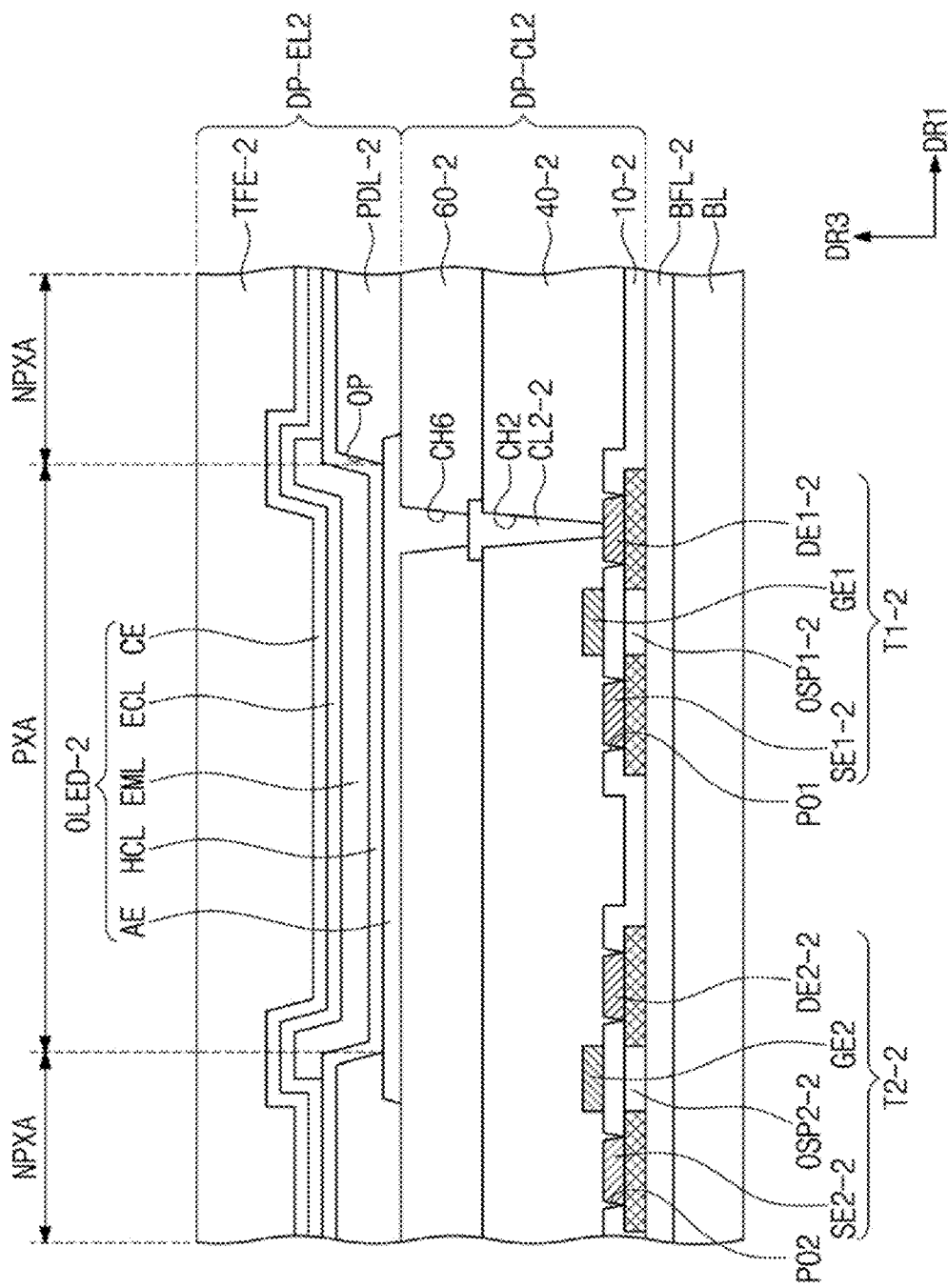
FIG. 6 is a cross-sectional view of a portion of a pixel according, to an exemplary embodiment of the present invention.

FIG. 6 is a cross-sectional view of a portion of a pixel according to an exemplary embodiment of the present invention.

Referring to FIG. 6, in an exemplary embodiment of the present invention, a circuit element layer DP-CL2 may include a first thin film transistor T1-2, a second thin film transistor T2-2, a second connection electrode CL2-2, and a plurality of insulating layer 10-2, 40-2 and 60-2. A display element layer DP-EL2 may include an organic light emitting diode OLED-2, a pixel defining layer PDL-2, and a thin film encapsulation layer TFE-2.

The first thin film transistor T1-2, the second connection electrode CL2-2 and the display element layer DP-EL2 described with reference to FIG. 6 may correspond to the first thin film transistor T1, the second connection electrode CL2 and the display element layer DP-EL described with reference to FIG. 4, respectively. Thus, duplicative descriptions may be omitted below.

The bridge electrode CNE and the second, third and fifth insulating layers 20, 30 and 50 may be omitted in a display panel according to an exemplary embodiment of the present invention.

A first semiconductor pattern OSP1-2 of the first thin film transistor T1-2 and a second semiconductor pattern OSP2-2 of the second thin film transistor T2-2 may be formed on a same layer (e.g., an inorganic layer BFL-2).

A first input electrode SE1-2 and a first output electrode DE1-2 of the first thin film transistor T1-2 may be disposed in first openings POI which are defined in the first insulating layer 10-2 to expose a first side and a second side of the first semiconductor pattern OSP1-2, respectively. The first input electrode SE1-2 and the first output electrode DE1-2 may be respectively embedded in the first openings PO1 and may be electrically connected to the first semiconductor pattern OSP1-2.

A second input electrode SE2-2 and a second output electrode DE2-2 of the second thin film transistor T2-2 may be disposed in second openings PO2 which are defined in the first insulating layer 10-2 to expose a first side and a second side of the second semiconductor pattern OSP2-2, respectively. The second input electrode SE2-2 and the second output electrode DE2-2 may be respectively embedded in the second openings PO2 and may be electrically connected to the second semiconductor pattern OSP2-2.

According to an exemplary embodiment of the present invention, the input electrodes and the output electrodes of the thin film transistors may be formed on a same layer and may have structures embedded in the insulating layer. The input electrodes and the output electrodes embedded in the same layer in an exemplary embodiment of the present invention may be formed through a photolithography process using the same mask.

According to an exemplary embodiment of the present invention, the first thin film transistor T1-2 and the second thin film transistor T2-2 may be formed on a same layer, and thus a relatively thin display panel may be provided.

Figure 7:
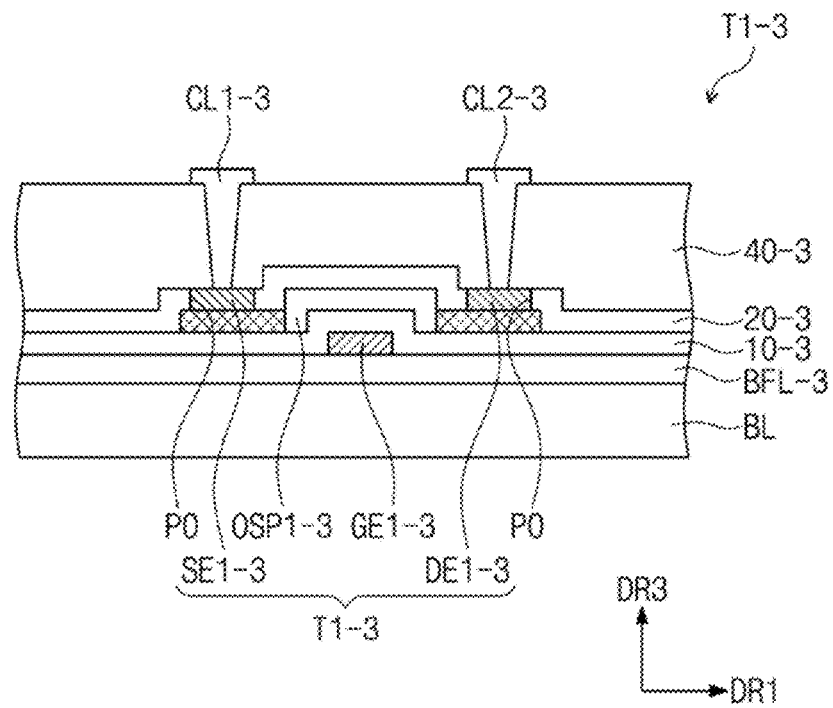
FIG. 7 is a cross-sectional view of a portion of a pixel according to an exemplary embodiment of the present invention.

FIG. 7 is a cross-sectional view of a portion of a pixel according, to an exemplary embodiment of the present invention. Descriptions of features or components that are the same or substantially the same as those described above with reference to FIGS. 1 to 4 may be omitted below.

Referring to FIG. 7, a first control electrode GE1-3 of a first thin film transistor T1-3 may be disposed directly on an inorganic layer BFL-3. A first insulating layer 10-3 may be disposed on the first control electrode GE1-3. A first semiconductor pattern OSP1-3 may be disposed on the first insulating layer 10-3. A second insulating layer 20-3 in which openings PO are defined may be disposed on the first semiconductor pattern OSP1-3. The openings PO may expose a first side and a second side of the first semiconductor pattern OSP1-3, respectively. A first input electrode SE1-3 and a first output electrode DE1-3 may be embedded in the openings PO, respectively. A fourth insulating layer 40-3 may substantially cover the second insulating layer 20-3 and the first input electrode SE1-3 and the first output electrode DE1-3 exposed by the second insulating layer 20-3. A first connection electrode CL1-3 and a second connection electrode CL2-3 may be connected to the first input electrode SE1-3 and the first output electrode DE1-3 through contact holes penetrating the fourth insulating layer 40-3, respectively. The structure described above according to an exemplary embodiment of the present invention may be applied to the second thin film transistor T2 as well as the first thin film transistor T1-3.

Figure 8:
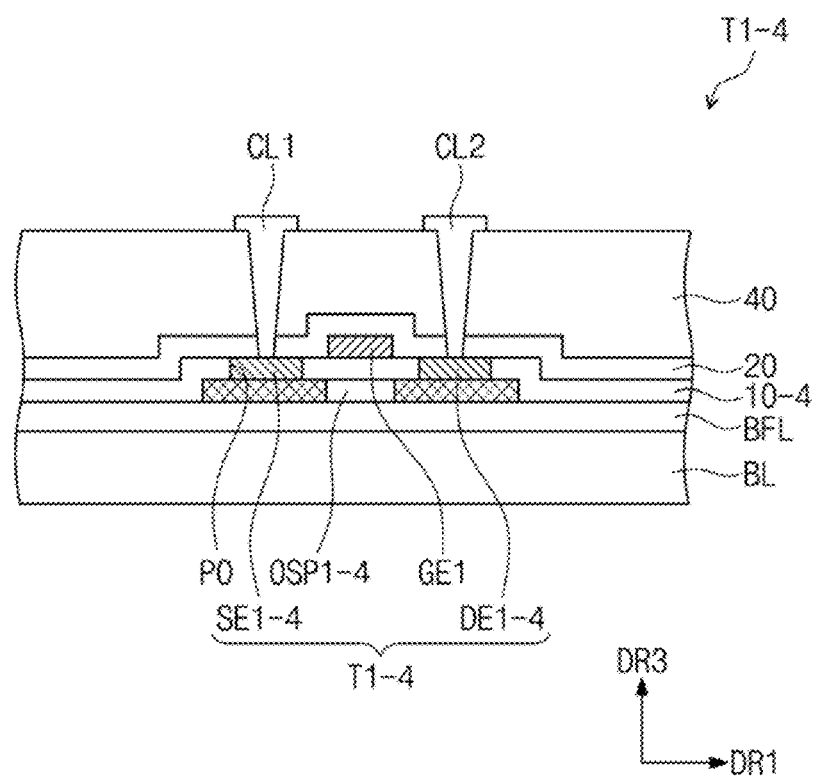
FIG. 8 is a cross-sectional view of a portion of a pixel according to an exemplary embodiment of the present invention.

FIG. 8 is a cross-sectional view of a portion of a pixel according to an exemplary embodiment of the present invention. Descriptions of features or components that are the same or substantially the same as those described above with reference to FIGS. 1 to 4 may be omitted below.

Referring to FIG. 8, a first input electrode SE1-4 and a first output electrode DE1-4 of a first thin film transistor T1-4 may be disposed in openings PO which are defined in a first insulating layer 10-4 to expose a first side and a second side of a first semiconductor pattern OSP1-4, respectively. The first input electrode SE1-4 and the first output electrode DE1-4 may be respectively embedded in the openings PO and may be electrically connected to the first semiconductor pattern OSP1-4.

According to an exemplary embodiment of the present invention, the first input electrode SE1-4 and the first output electrode DE1-4 may substantially completely fill the openings PO, respectively. Thus, side surfaces of the first input electrode SE1-4 and the first output electrode DE1-4 may be in direct contact with side surfaces of the first insulating layer 10-4, In addition, the first input electrode SE1-4 and the first output electrode DE1-4 might not overlap with the first insulating layer 10-4 when viewed in a plan view (e.g., along the third direction DR3).

FIGS. 9A, 9B, 9C, 9D, 9E, 9F, 9G, 9H, 9I, 9J, 9K and 9L are cross-sectional views of a method of manufacturing a display panel, according to an exemplary embodiment of the present invention. For example. FIGS. 9A to 9L illustrate an exemplary method of manufacturing the display panel DP described with reference to FIG. 4. Descriptions of features or components that are the same or substantially the same as those described above with reference to FIGS. 1 to 4 may be omitted below.

Figure 9A:
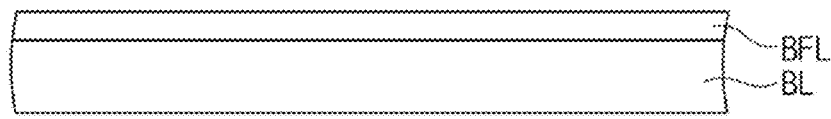
FIGS. 9A, 9B, 9C, 9D, 9E, 9F, 9G, 9H, 9I, 9J, 9K and 9L are cross-sectional views of a method of manufacturing a display panel, according to an exemplary embodiment of the present invention.
Figure 9A:
Figure 9B:
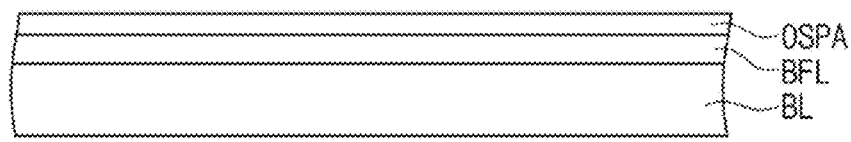
Figure 9B:
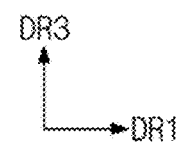
Figure 9C:
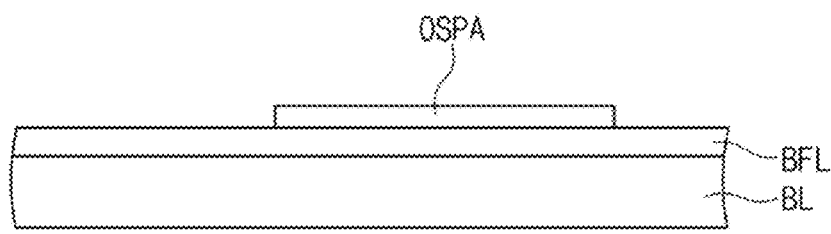
Figure 9C:
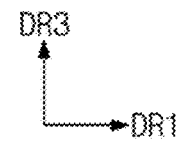

Referring to FIGS. 9A to 9C, an inorganic layer BFL may be formed on a base layer BL. The inorganic layer BFL may be formed by depositing, coating or printing an inorganic material on the base layer BL. A barrier layer may be formed between the base layer BL and the inorganic layer BFL.

An initial first semiconductor pattern OSPA may be formed on the base layer BL or the inorganic layer BFL. A crystalline semiconductor material may be deposited, and the deposited crystalline semiconductor material may be patterned to form the initial first semiconductor pattern OSPA.

Figure 9D:
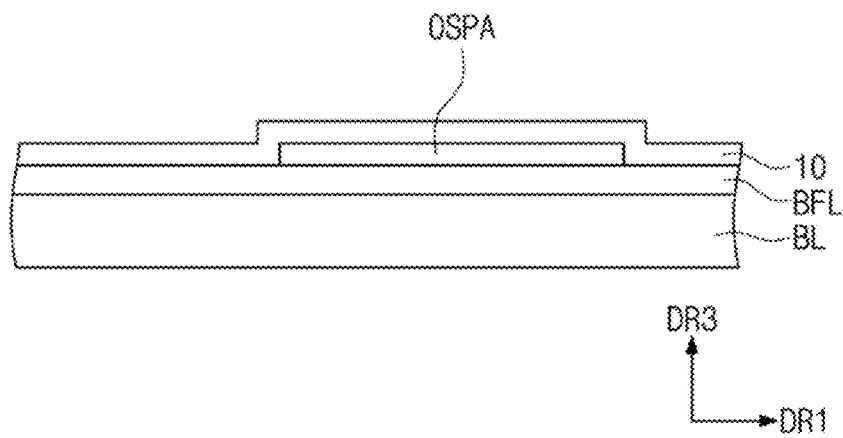

A first insulating layer 10 may be formed to substantially cover the initial first semiconductor pattern OSPA and the inorganic layer BFL see, (e.g., FIG. 9D). The first insulating layer 10 may be formed by depositing, coating or printing an inorganic material and/or an organic material on the inorganic layer BFL.

Figure 9E:
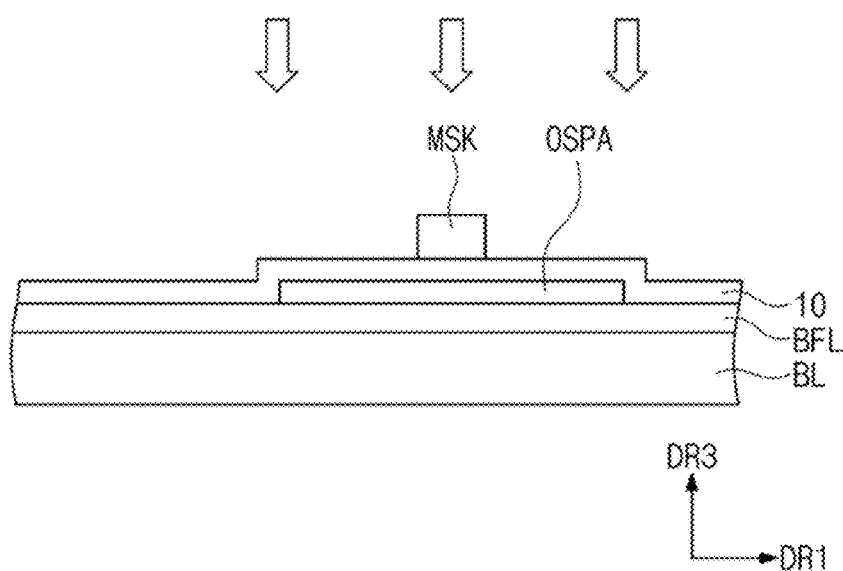
Figure 9F:
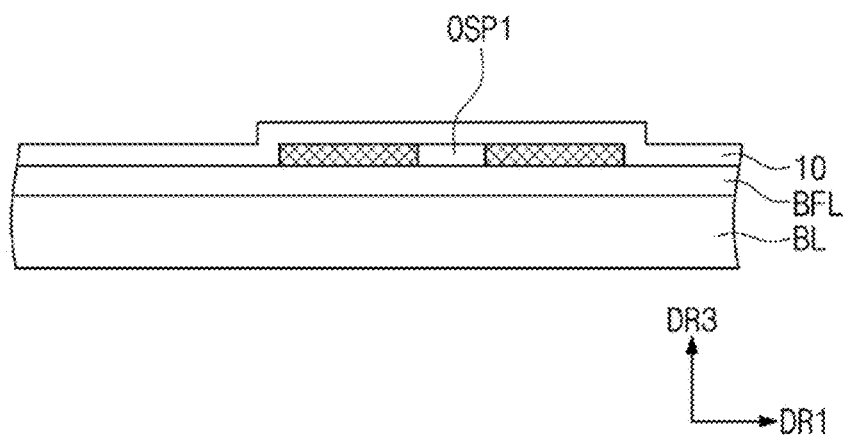

Referring to FIGS. 9E and 9F, a mask MSK may be disposed on the first insulating layer 10 to overlap with the initial first semiconductor pattern OSPA (e.g., along the third direction DR3). The initial first semiconductor pattern OSPA may be doped with dopants. The dopants may be injected into the initial first semiconductor pattern OSPA by, for example, a diffusion process or an ion implantation process. However, exemplary embodiments of the present invention are not limited to a specific method.

A region (e.g., a channel region) of the initial first semiconductor pattern OSPA, which overlaps with the mask MSK (e.g., along the third direction DR3), need not be doped with the dopants. Regions (e.g., an input region and an output region) of the initial first semiconductor pattern OSPA, which are disposed at opposite sides of the channel region, may be doped with the dopants. In an exemplary embodiment of the present invention, the input region and the output region may be doped with N-type dopants, (e.g., a pentavalent element). As a result, a first semiconductor pattern OSP1 may be formed.

Figure 9G:
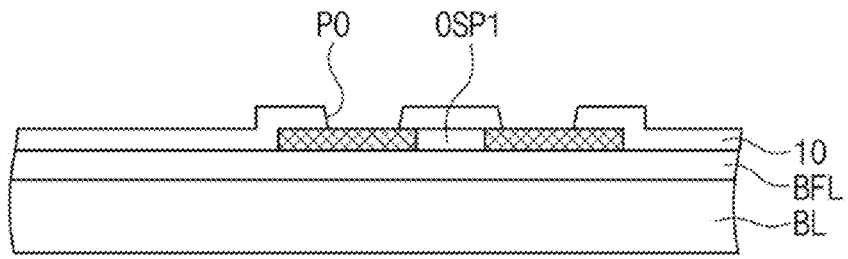
Figure 9G:
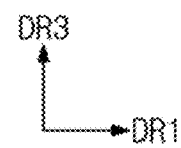

The first insulating layer 10 may be etched to form openings PO which expose the input region and the output region of the first semiconductor pattern OSP1 respectively (see, e.g., FIG. 9G).

Figure 9H:
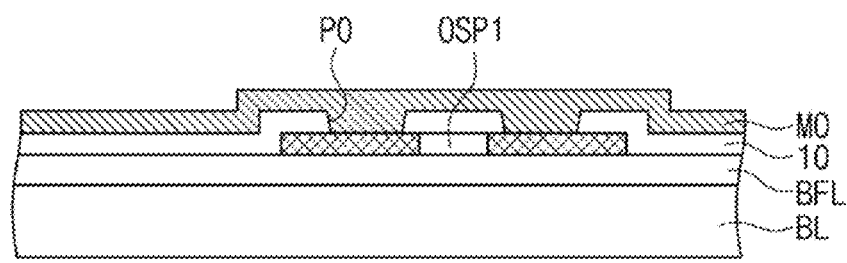
Figure 9H:
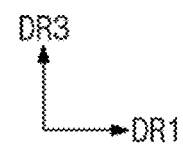
Figure 9I:
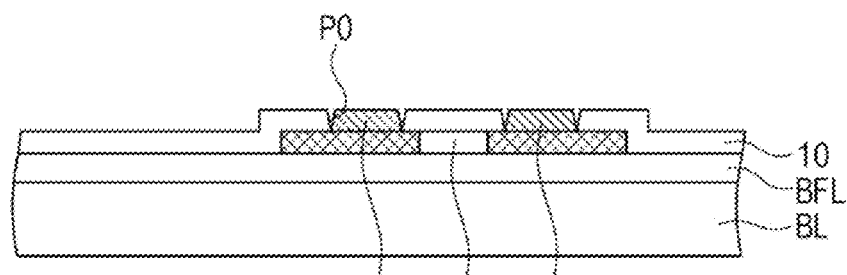
Figure 9I:
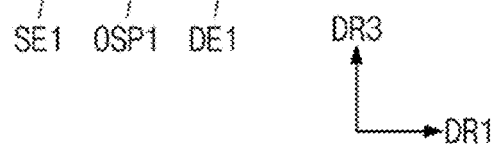

A first input electrode SE1 and a first output electrode DE1 may be formed from a conductive layer MO (see, e.g., FIGS. 9H and 9I). The conductive layer MO may be deposited on the first insulating layer 10, and then, a polishing process may be performed on the conductive layer MO to form the first input electrode SE1 and the first output electrode DE1. The conductive layer MO may be polished to expose a top surface of the first insulating layer 10, and thus portions of the conductive layer MO may be confinedly embedded in the openings PO.

Thicknesses of the first input electrode SE1 and the first output electrode DE1 embedded in the openings PO may be substantially equal to a thickness of the first insulating layer 10 adjacent thereto (e.g., along the third direction DR3). However, exemplary embodiments of the present invention are not limited thereto. Exemplary embodiments of the present invention may include a tolerance of a thickness which may occur in a process. Thus, the thicknesses described herein may vary slightly. As an example, the thicknesses of the first input electrode SE1 and the first output electrode DE1 may be slightly less or greater than the thickness of the first insulating layer 10.

Figure 9J:
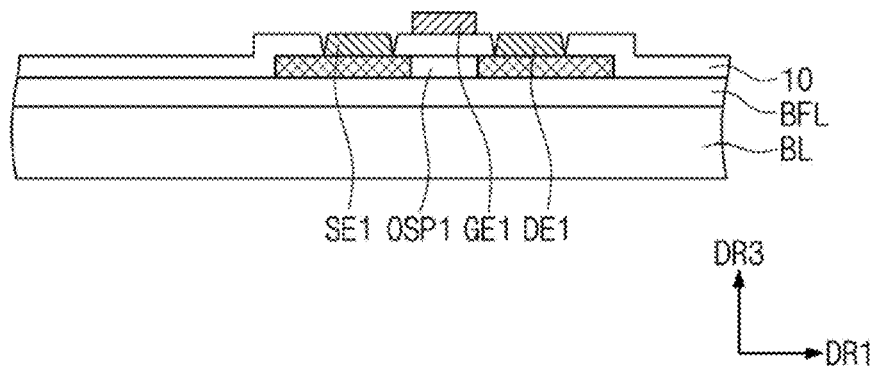

Referring to FIG. 9J, a conductive layer may be patterned to form a first control electrode GE1 of a first thin film transistor T1. The first control electrode GE1 and one of electrodes of the capacitor Cst (see, e.g., FIG. 3) may be formed at substantially the same time by a patterning process using the same mask.

Figure 9K:
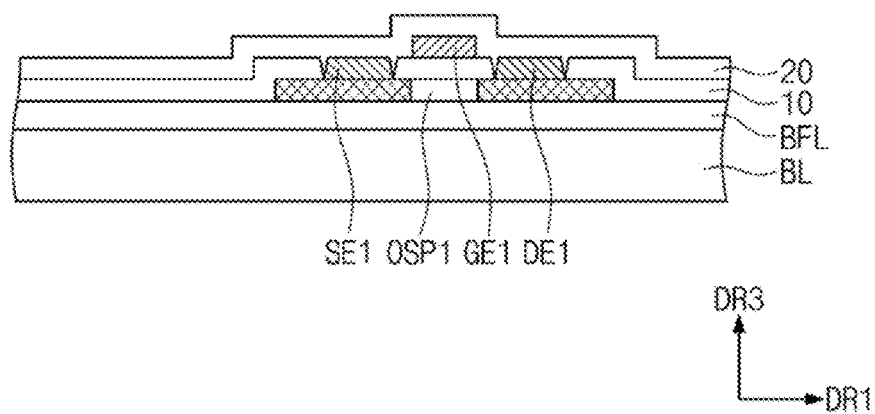
Figure 9L:
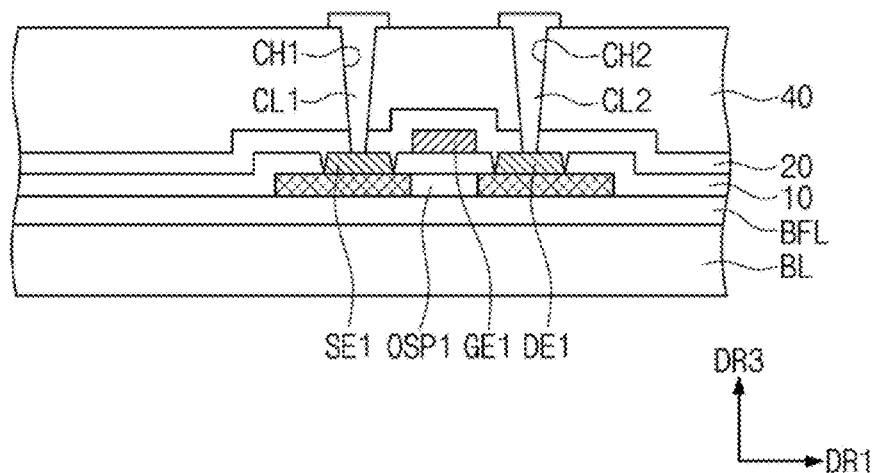

Referring to FIGS. 9K and 9L, a second insulating layer 20 may be formed to substantially cover the first insulating layer 10 and the first thin film transistor T1. The second insulating layer 20 may be formed by depositing, coating or printing an inorganic material and/or an organic material. A fourth insulating layer 40 may be formed on the second insulating layer 20. The fourth insulating layer 40 may include an inorganic layer and/or an organic layer and may have a single-layered or multi-layered structure. The fourth insulating layer 40 may be etched to form contact boles CH1 and CH2 which overlap with the first input electrode SE1 and the first output electrode DE1, respectively (e.g., along the third direction DR3).

A first connection electrode CL1 and a second connection electrode CL2 may be formed. The first connection electrode CL1 and the second connection electrode CL2 may be connected to the first input electrode SE1 and the first output electrode DE1 through the first contact hole CH1 and the second contact hole CH2, respectively.

The process of forming the contact holes CH1 and CH2 in an exemplary embodiment of the present invention may use the same mask as a mask used to form the openings PO of the first insulating layer 10, in which the first input electrode SE1 and the first output electrode DE1 are embedded. Thus, the contact holes CH1 and CH2 may be formed to be accurately aligned with positions at which the first input electrode SE1 and the first output electrode DE1 are embedded. As a result, misalignment which may occur in an etching process may be reduced or eliminated. Accordingly, connection reliability between the electrodes in the display panel may be increased. In addition, since the number of masks is reduced, a process cost may be reduced.

While the present invention has been shown and described with reference to the exemplary embodiments thereof it will be apparent to those of ordinary skill in the art that various changes in form and detail may be made thereto without departing from the spirit and scope of the present invention.

What is claimed is:

1. A display panel comprising:
    a base layer;
    a first thin film transistor disposed on the base layer and comprising: a silicon semiconductor pattern; a first control electrode spaced apart from the silicon semiconductor pattern; a first input electrode connected to a first side of the silicon semiconductor pattern; and a first output electrode connected to a second side of the silicon semiconductor pattern;
    a second thin film transistor disposed on the base layer and comprising: an oxide semiconductor pattern; a second control electrode spaced apart from the oxide semiconductor pattern; a second input electrode connected to a first side of the oxide semiconductor pattern; and
a second output electrode connected to a second side of the oxide semiconductor pattern;
    an organic light emitting diode connected to the first-thin film transistor; and
    a first insulating layer covering the silicon semiconductor pattern and the oxide semiconductor pattern and comprising: a plurality of openings exposing a portion of the silicon semiconductor pattern and the oxide semiconductor pattern, respectively, the first insulating layer having an upper surface directly contacting the first and second control electrodes,
    wherein the first input electrode, the first output electrode, the second input electrode, the second output electrode are each positioned in an opening of the plurality of openings, respectively, and
    wherein an upper surface of the first input electrode, an upper surface of the first output electrode, an upper surface of the second input electrode, and an upper surface of the second output electrode define the same plane as the upper surface of the first insulating layer.

2. The display panel of claim 1, wherein the organic light emitting diode comprising:
    a first electrode connected to the first thin film transistor:
    a second electrode disposed on the first electrode; and
    an emission layer disposed between the first electrode and the second electrode.

3. The display panel of claim 2, further comprising:
    a first connection electrode connected to the first output electrode.

4. The display panel of claim 3, further comprising:
    a second insulating layer covering the first control electrode and the second control electrode and disposed on the first insulating layer, a third insulating layer disposed on the second insulating layer, and
    wherein the first connection electrode is disposed on the second insulating layer and the first connection electrode is covered by the third insulating layer.

5. The display panel of claim 4, wherein the first connection electrode is connected to the first output electrode through a first contact hole included in the second insulating layer, and
    the first electrode is connected to the first output electrode through a second contact hole included in the third insulating layer.

6. The display panel of claim 1, wherein the first control electrode and the second control electrode are disposed on the first insulating layer.

7. The display panel of claim 1, in the first insulating layer, wherein each of a plurality of side surfaces defining the plurality of openings is inclined at a predetermined angle.

* * * * *